(12) United States Patent
Komoto et al.

(10) Patent No.: US 8,091,863 B2
(45) Date of Patent: Jan. 10, 2012

(54) GATE VALVE AND SEMICONDUCTOR MANUFACTURING APPARATUS

(75) Inventors: Shinji Komoto, Amagasaki (JP);
Toshihisa Nozawa, Amagasaki (JP)

(73) Assignee: Tokyo Electron Limited (JP)

( * ) Notice: Subject to any disclaimer, the term of this patent is extended or adjusted under 35 U.S.C. 154(b) by 408 days.

(21) Appl. No.: 12/401,076

(22) Filed: Mar. 10, 2009

(65) Prior Publication Data
US 2009/0230342 A1   Sep. 17, 2009

(30) Foreign Application Priority Data

Mar. 12, 2008   (JP) .................................. 2008-062478

(51) Int. Cl.
*F16K 1/16* (2006.01)
(52) U.S. Cl. ........ 251/301; 251/326; 251/900; 414/217; 414/935
(58) Field of Classification Search .................. 251/328, 251/326, 301, 900; 414/217, 221, 935, 939
See application file for complete search history.

(56) References Cited

U.S. PATENT DOCUMENTS

| | | | | |
|---|---|---|---|---|
| 1,645,785 A * | 10/1927 | Wilson | ........................... | 251/203 |
| 4,163,544 A * | 8/1979 | Fowler et al. | ................... | 251/328 |
| 4,657,621 A * | 4/1987 | Johnson et al. | .......... | 156/345.31 |
| 4,851,101 A * | 7/1989 | Hutchinson | .............. | 204/298.09 |
| 5,363,872 A * | 11/1994 | Lorimer | ........................... | 137/1 |
| 5,769,952 A * | 6/1998 | Komino | ........................ | 118/733 |
| 6,042,372 A * | 3/2000 | Sakata et al. | ................... | 432/241 |
| 6,629,682 B2 * | 10/2003 | Duelli | ........................... | 251/158 |
| 6,764,265 B2 * | 7/2004 | Kunze et al. | ................ | 414/217.1 |
| 7,011,294 B1 * | 3/2006 | Ehrne et al. | ................... | 251/328 |
| 7,083,161 B2 * | 8/2006 | Wallace | ........................ | 251/301 |
| 2004/0052618 A1 * | 3/2004 | Matsunaga et al. | ........... | 414/217 |

FOREIGN PATENT DOCUMENTS

| | | |
|---|---|---|
| JP | 11-248011 | 9/1999 |
| JP | 2004-141803 | 5/2004 |
| JP | 2004-286131 | 10/2004 |
| JP | 2007-085460 | 4/2007 |

OTHER PUBLICATIONS

Notice of Preliminary Rejection issued by Korean Intellectual Property Office on Jan. 19, 2011, citing JP2007-085460, JP11-2480011 and JP2004-286131.

* cited by examiner

*Primary Examiner* — John Bastianelli
(74) *Attorney, Agent, or Firm* — Cantor Colburn LLP (57) ABSTRACT

A gate valve of a semiconductor manufacturing apparatus, which is formed between a processing chamber in which processing is performed and a transfer chamber which carries a substrate on which the processing is performed, includes a gate valve at a side of the processing chamber; a sealing member which is formed in the gate valve at the side of the processing chamber; a gate valve at the side of the transfer chamber; a sealing member which is formed in the gate valve at the side of the transfer chamber; and a thermal insulator which is formed between the gate valve at the side of the processing chamber and the gate valve at the side of the transfer chamber.

10 Claims, 4 Drawing Sheets

FIG. 1

CONTROL UNIT

GATE VALVE AND SEMICONDUCTOR MANUFACTURING APPARATUS

CROSS-REFERENCE TO RELATED PATENT APPLICATION

This application claims the benefit of Japanese Patent Application No. 2008-062478 filed on Mar. 12, 2008, in the Japan Patent Office, the disclosure of which is incorporated herein in their entirety by reference.

BACKGROUND OF THE INVENTION

1. Field of the Invention

The present invention relates to a gate valve and a semiconductor manufacturing apparatus, and more particularly, to a gate valve that seals an opening through which a substrate is carried into and out of a processing device, and a semiconductor manufacturing apparatus including the gate valve.

2. Description of the Related Art

Plasma technology is broadly used in many semiconductor devices such as integrated circuits, liquid crystal displays, solar batteries, and so on. The plasma technology is used in, for example, a coating or etching process performed on a thin film during a semiconductor manufacturing procedure. However, a high level plasma processing technology such as an ultra fine processing technology is required to manufacture a product having a higher performance and functionality. A microwave plasma processing device using plasma in a microwave band is one particular example.

When plasma processing is performed, space for the plasma processing is maintained at a high temperature in a vacuum. A transfer chamber used for carrying a substrate is separated from a plasma processing chamber by a gate valve. An O-ring included in the gate valve is easy to deteriorate in a plasma atmosphere and in general, O-rings cannot maintain plasma resistance and sealability at the same time. In order to prevent defects in a processed substrate due to a generation of particles or a reduction in sealability caused by deterioration of the O-ring in the plasma atmosphere, the O-ring is regularly changed in most cases, which can cause an increase in maintenance time and a reduction in operating time.

Reference 1 (Japanese Patent Publication No. 2004-141803) discloses a plasma processing device that prevents a generation of particles and a reduction in sealability caused by deterioration of the O-ring. In the plasma processing apparatus according to Reference 1, two gate valves are arranged between a reaction chamber and a transfer chamber, an O-ring made of metal meshes is provided at a side of the reaction chamber, and an O-ring made of a fluorine resin-based material is provided at a side of the transfer chamber, thereby blocking a plasma atmosphere.

Since plasma processing is performed at a high temperature, the gate valves are exposed to the high temperature. If a sealing member included in a gate valve is used under high temperature conditions or under frequently varying temperature conditions, the sealing member can deteriorate more rapidly in comparison to a case when the sealing member is used under normal room temperature conditions. Thus the deterioration can lead to particle generation and the sealing member should be changed frequently. Also, seal reliability can be reduced.

Furthermore, a sealing member having plasma resistance generally has lower durability and thus should be more frequently changed in comparison to a sealing member having sealability. Then a plasma processing device should be down or evacuated whenever the sealing member is changed. Therefore, operation efficiency is reduced.

SUMMARY OF THE INVENTION

The present invention provides a gate valve and a semiconductor manufacturing apparatus, which may maintain an operating rate high by preventing a deterioration of a sealing member which leads to a reduction in sealability and generation of particles.

According to an aspect of the present invention, there is provided a gate valve of a semiconductor manufacturing apparatus, which is arranged between a processing chamber and a transfer chamber which carries a substrate to be processed, the gate valve including a gate valve at a side of the processing chamber, which opens and closes an opening of the processing chamber; a sealing member attached to the gate valve at the side of the processing chamber and seals a clearance between the opening of the processing chamber and a valve body of the gate valve at the side of the processing chamber; a gate valve at the side of the transfer chamber, which opens and closes an opening of the transfer chamber; a sealing member attached to the gate valve at the side of the transfer chamber and seals a clearance between the opening of the transfer chamber and a valve body of the gate valve at the side of the transfer chamber; and a thermal insulator which suppresses heat transfer between the gate valve at the side of the processing chamber and the gate valve at the side of the transfer chamber.

The sealing member attached to the gate valve at the side of the processing chamber may have a resistance to the processing atmosphere being equal to or greater than that of the sealing member attached to the gate valve at the side of the transfer chamber.

The sealing member attached to the gate valve at the side of the transfer chamber may have a sealability equal to or greater than that of a sealing member attached to the gate valve at the side of the processing chamber.

The processing may be plasma processing, and the sealing member attached to the gate valve at the side of the processing chamber may have a plasma resistance equal to or greater than that of a sealing member attached to the gate valve at the side of the transfer chamber.

The sealing member attached to the gate valve at the side of the processing chamber may include an inner sealing member which is placed adjacent to the processing chamber; and an outer sealing member which is placed to surround the inner sealing member.

A resistance of each of the inner and outer sealing members to at least one of heat, microwaves, and plasma (radicals) may be equal to or greater than that of the sealing member attached to the gate valve at the side of the transfer chamber, and a resistance of the inner sealing member to an atmosphere of the processing chamber may be equal to or greater than that of the sealing member attached to the gate valve at the side of the transfer chamber.

The inner sealing member may have plasma (radicals) resistance greater than the outer sealing member, the outer sealing member may have sealability greater than the inner sealing member, and the sealability may be equal to that of the sealing member attached to the gate valve at the side of the transfer chamber.

According to another aspect of the present invention, there is provided a semiconductor manufacturing apparatus including a processing chamber in which a substrate processing is performed; a transfer chamber which carries a substrate to be processed; and the above gate valve which connects the processing chamber and the transfer chamber.

The semiconductor manufacturing apparatus may include two or more processing chambers; and a plurality of gate valves which separately connect the transfer chamber to the two or more processing chambers, and at least one of the plurality of gate valves which separately connect the transfer chamber to the two or more processing chambers may be the above gate valve.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining embodiments of the invention with reference to the attached drawings. Like reference numerals in the drawings denote like elements and thus repeated descriptions thereof will be omitted.

Figure 1:
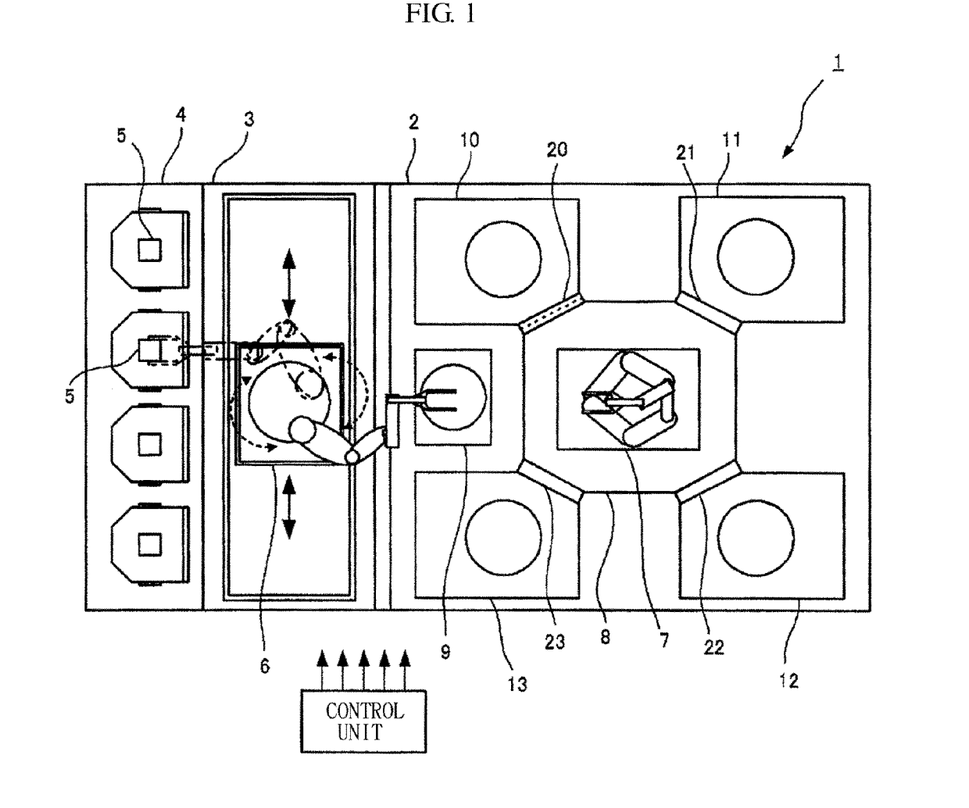
FIG. 1 is a schematic diagram of a semiconductor manufacturing apparatus according to an embodiment of the present invention.

FIG. 1 is a schematic diagram of a semiconductor manufacturing apparatus 1 according to an embodiment of the present invention. For example, the semiconductor manufacturing apparatus 1 is an apparatus used to manufacture a wafer in semiconductor manufacturing processes including plasma processing.

Referring to FIG. 1, the semiconductor manufacturing apparatus 1 includes a processing station 2 and a cassette station 3. A unit carrying mechanism 7, a transfer chamber 8, a temporary holding stage 9, and processing units 10, 11, 12, and 13 are set in the processing station 2. Gate valves 20, 21, 22, and 23 connect the transfer chamber 8 to the processing units 10, 11, 12, and 13, respectively.

A cassette holding stage 4 is positioned adjacent to the cassette station 3. wafers W are provided in units of a wafer in the cassettes from outside of the apparatus. And the wafer W is carried into the processing station 2 of the semiconductor manufacturing apparatus 1, and the wafer W is carried out of the processing station 2 to the cassettes 5 when it is processed. The wafer W is carried from/to the cassette holding stage 4 by using a station carrying mechanism 6. The station carrying mechanism 6 can move in a horizontal direction (a solid arrow direction) and a vertical direction (a direction perpendicular to the ground) so as to be accessible to the plural cassettes 5 which are held on the cassette holding stage 4. Also, the station carrying mechanism 6 is rotatable (in a dotted arrow direction) so as to allow the wafer W to be carried from the processing station 2 to the cassette holding stage 4.

The wafer W carried into the processing station 2 is held on the temporary holding stage 9 by the station carrying mechanism 6 and then is carried by the unit carrying mechanism 7. Similarly to the station carrying mechanism 6, the unit carrying mechanism 7 can move in the horizontal and vertical directions, and is rotatable. The wafer W is carried into the transfer chamber 8 by the unit carrying mechanism 7. When the wafer W is carried out of the transfer chamber 8 into the processing units 10, 11, 12, and 13, the gate valves 20, 21, 22, and 23 between the transfer chamber 8 and the processing units 10, 11, 12, and 13 are opened respectively. The gate valves 20, 21, 22, and 23 slide down or up so as to be opened or closed.

The wafer W is processed by sequentially moving the wafer W to the processing units 10, 11, 12, and 13. A control unit includes a read-only memory (ROM) that stores, for example, a processing program, and controls processes performed by each of the semiconductor manufacturing apparatus 1 and the processing units 10, 11, 12, and 13. When the wafer W is completely processed, it is held on the temporary holding stage 9 again, and then is carried out of the processing station 2 by the station carrying mechanism 6.

Figure 2:
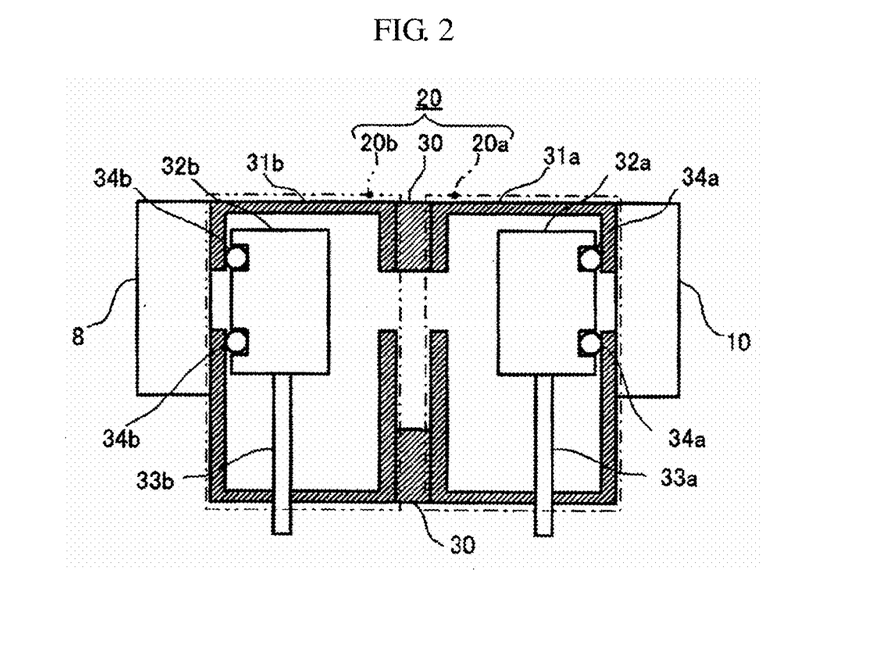
FIG. 2 is a cross-sectional diagram of a gate valve of the semiconductor manufacturing apparatus according to an embodiment of the present invention.
Figure 3:
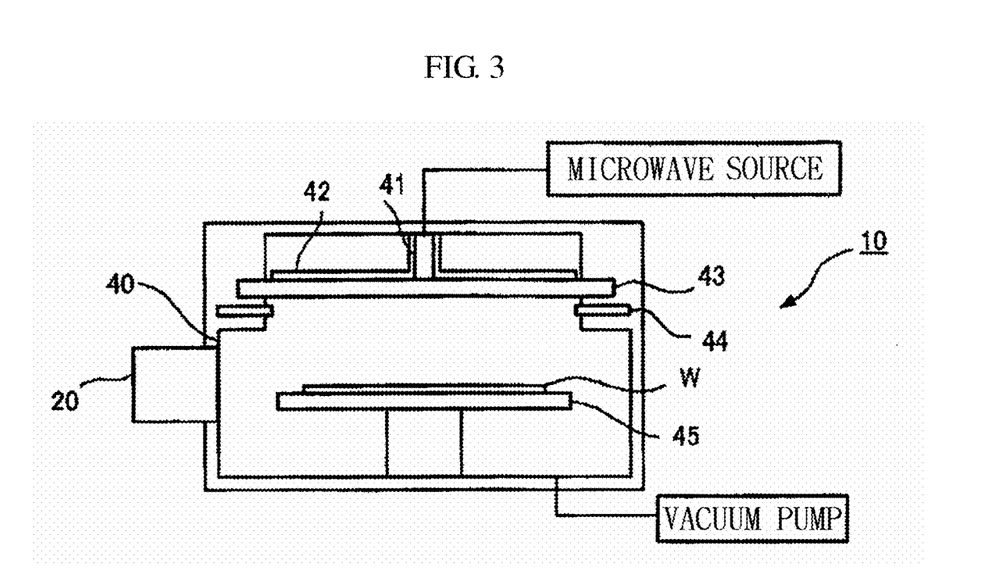
FIG. 3 is a cross-sectional diagram of a plasma processing unit of the semiconductor manufacturing apparatus according to an embodiment of the present invention.

FIG. 2 is a cross-sectional diagram of the gate valve 20 of the semiconductor manufacturing apparatus 1 according to an embodiment of the present invention. FIG. 3 is a cross-sectional diagram of a plasma processing unit of the semiconductor manufacturing apparatus 1 according to an embodiment of the present invention. The gate valves 20, 21, 22, and 23 block atmospheres within the processing units 10, 11, 12, and 13 so as to prevent the atmospheres from leaking toward the transfer chamber 8.

Referring to FIGS. 2 and 3, the gate valve 20 includes gate valves 20a and 20b, and a thermal insulator 30 between the gate valves 20a and 20b. The gate valve 20a includes a valve box 31a, a valve body 32a, a stem 33a, and an O-ring 34a embedded in the valve body 32a. The gate valve 20b includes a valve box 31b, a valve body 32b, a stem 33b, and an O-ring 34b embedded in the valve body 32b. The valve boxes 31a and 31b, the valve bodies 32a and 32b, and the stems 33a and 33b may be formed of a material having an electromagnetic shield effect, for example, aluminium.

The gate valve 20a is located at a side of the processing unit 10, and the O-ring 34a seals an atmosphere of the processing unit 10. The O-ring 34a is resistant to the atmosphere of the processing unit 10 and may be formed of, for example, tetrafluoroethylene-perfluorovinylether-based perfluoroelastomer (FFKM) having plasma resistance and thermal resistance.

The gate valve 20b is located at a side of the transfer chamber 8, and the O-ring 34b is used for separating the transfer chamber 8 from the processing unit 10. The O-ring 34b may be formed of, for example, fluorine rubber having high sealability.

The processing unit 10 is a plasma processing unit, and includes a plasma processing (reaction) chamber 40, a waveguide 41, an antenna 42, a top plate 43, a gas inlet 44, and a substrate holding stage 45. The reaction chamber 40 is covered by the top plate 43. In this case, an internal space of the reaction chamber 40 is maintained in a high vacuum state having a relatively low pressure from about 10 mPa to about several 10 Pa by using a vacuum pump. The antenna 42 is connected to the top plate 43. The waveguide 41 is connected to the antenna 42. The antenna 42 includes a radial line slot antenna (RLSA) that spreads microwaves in a radial direction and a wavelength-shortening plate that compresses microwave wavelengths. The top plate 43 is formed of a dielectric material. Microwaves are provided from a microwave source through the waveguide 41 and are radiated from the antenna 42. The microwaves propagate through the top plate 43 such that the microwaves have a plane of polarization. The microwaves form a circularly polarized wave as a whole.

When the microwaves are provided to the reaction chamber 40 so as to generate plasma, argon (Ar) or xenon (Xe) plasma is formed by introducing Ar or Xe, and an inactive gas such as nitrogen ($N_2$), if necessary, together with a process gas such as hydrogen through the gas inlet 44. Plasma processing may be performed on a wafer W held on the substrate holding stage 45.

While the plasma is being formed, the reaction chamber 40 of the processing unit 10 is maintained in the high vacuum state at a high temperature that is optimum for forming the plasma. The gate valve 20 may suppress thermal conductivity and block the processing unit 10 from the transfer chamber 8, by using the thermal insulator 30 between the gate valves 20a and 20b. Accordingly, the plasma processing may be performed in the processing unit 10 without thermally influencing the other processing units 11, 12, and 13 and the transfer chamber 8 of the semiconductor manufacturing apparatus 1. Operation of the gate valve 20 before and after performing the plasma processing will now be described. The gate valve 20 is opened by sliding down the valve bodies 32a and 32b of the gate valve 20, and the unit carrying mechanism 7 carries the wafer W into the processing unit 10. The wafer W on which the plasma processing is to be performed is held on the substrate holding stage 45 of the reaction chamber 40. The gate valve 20b is closed by sliding up the valve body 32b at the side of the transfer chamber 8, and the internal space of the reaction chamber 40 and the gate valve 20 is kept to be vacuum by using the vacuum pump. Then, the gate valve 20a is closed by sliding up the valve body 32a at the side of the processing unit 10, and the plasma processing is performed in the reaction chamber 40.

The O-ring 34a is exposed to a plasma atmosphere and thus is formed of a material having plasma (radicals) resistance. The processing unit 10 is maintained at an optimum temperature for generating plasma. The gate valve 20a connected to the processing unit 10 is maintained at about 150 degree Celcius to about 200 degree Celcius and thus the O-ring 34a embedded in the gate valve 20a is required to have thermal resistance.

The O-ring 34b is formed of a material having high sealability so as to block an atmosphere of the processing unit 10, to prevent the atmosphere from leaking toward the transfer chamber 8, and to prevent an atmosphere of the transfer chamber 8 from entering the processing unit 10. The plasma atmosphere in the reaction chamber 40 is inhibited by the O-ring 34a embedded in the gate valve 20a and thus may not enter the gate valve 20 and the transfer chamber 8. Accordingly, the O-ring 34b embedded in the gate valve 20b is not exposed to the plasma atmosphere and does not easily deteriorate, thereby preventing a generation of particles and a reduction in sealability.

Also, heat transfer is suppressed by the thermal insulator 30 in the gate valve 20 and thus the gate valve 20b may be maintained at the same temperature as the transfer chamber 8 (mostly kept at room temperature). The O-ring 34b is not influenced by a high temperature or temperature variations and thus does not easily deteriorate, thereby maintaining seal reliability. Thus, the O-ring 34b may be formed of a material having high sealability without considering temperature. Accordingly, problems caused by a generation of particles or a reduction in sealability are reduced, the number of times that the O-ring 34b needs to be changed is also reduced, and thus maintenance time decreases.

The wafer W on which the plasma processing is completely performed is carried out of the processing unit 10 in a reverse order of being carried into the processing unit 10. Initially, the gate valve 20a is opened by sliding down the valve body 32a of the gate valve 20a, and vacuum operation stopped. Then, the gate valve 20b is opened by sliding down the valve body 32b of the gate valve 20b. After a space between the processing unit 10 and the transfer chamber 8 is opened, the unit carrying mechanism 7 carries the wafer W out of the processing unit 10. Although the processing unit 10 is at a high temperature, the thermal insulator 30 suppresses heat transfer from the processing unit 10 and thus the gate valve 20b may be maintained at the same temperature as the transfer chamber 8 (mostly kept at room temperature). If particles are generated in the processing unit 10 or in the gate valve 20 due to a thermophoresis, the particles are adhered to an internal wall of the gate valve 20b where the temperature rapidly decreases. As a result, the number of floating particles may be reduced and thus the wafer W or the processing unit 10 may be kept clean.

Although the O-ring 34a of the gate valve 20a connected to the processing unit 10 is formed of a material having plasma (radicals) resistance and thermal resistance, the O-ring 34a has a shorter lifespan than the O-ring 34b of the gate valve 20b connected to the transfer chamber 8 (low temperature). Accordingly, an O-ring at the side of the processing unit 10 should be more frequently changed and thus only the O-ring 34a of the gate valve 20a may be changed after a predetermined period of time. In this case, the processing unit 10 may be blocked from the transfer chamber 8 by closing the gate valve 20b at the side of the transfer chamber 8, and the O-ring 34a may be changed without stopping the other processing units 11, 12, and 13 of the semiconductor manufacturing apparatus 1.

If the temperature at which the plasma processing is performed in the processing unit 10 is high and a resin such as tetrafluoroethylene-perfluorovinylether-based perfluoroelastomer (FFKM) that forms the O-ring 34a does not have sufficient thermal resistance, metal O-rings may be used as the O-ring 34a. Although the metal O-rings need to be regularly changed due to plastic deformation when they are maintained in a compressed state, by using the gate valve 20, the O-ring 34a may be changed without stopping the other processing units 11, 12, and 13, thereby maintaining an operating rate of the semiconductor manufacturing apparatus 1.

Figure 4A:
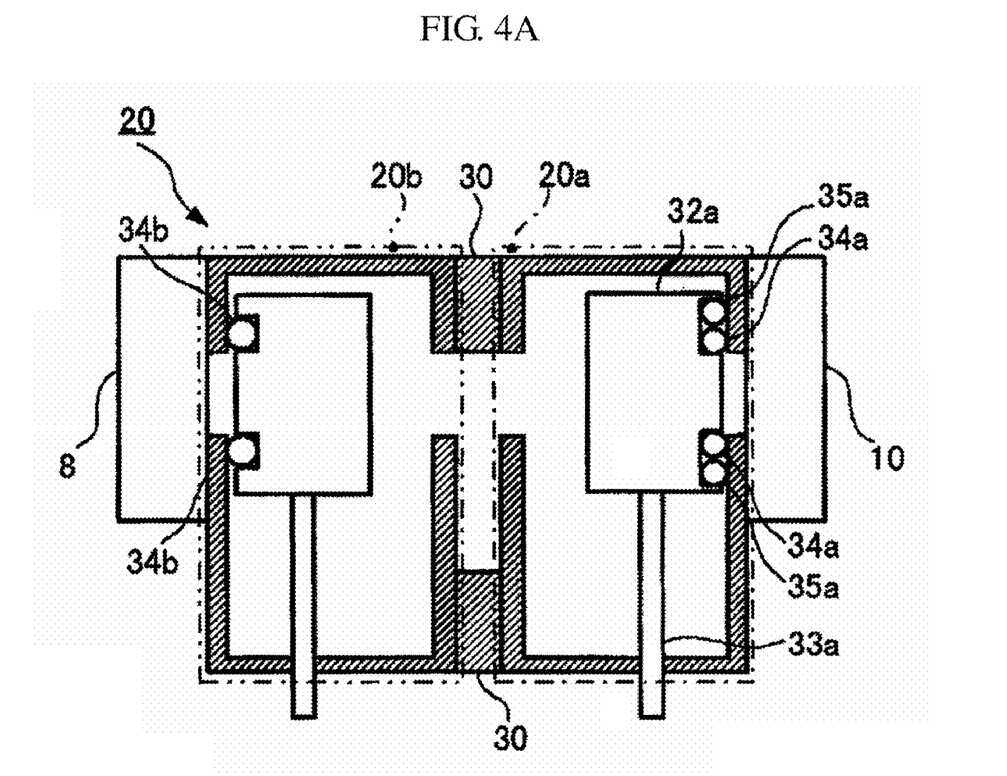
FIG. 4A is a cross-sectional diagram of a gate valve of the semiconductor manufacturing apparatus according to another embodiment of the present invention.
Figure 4B:
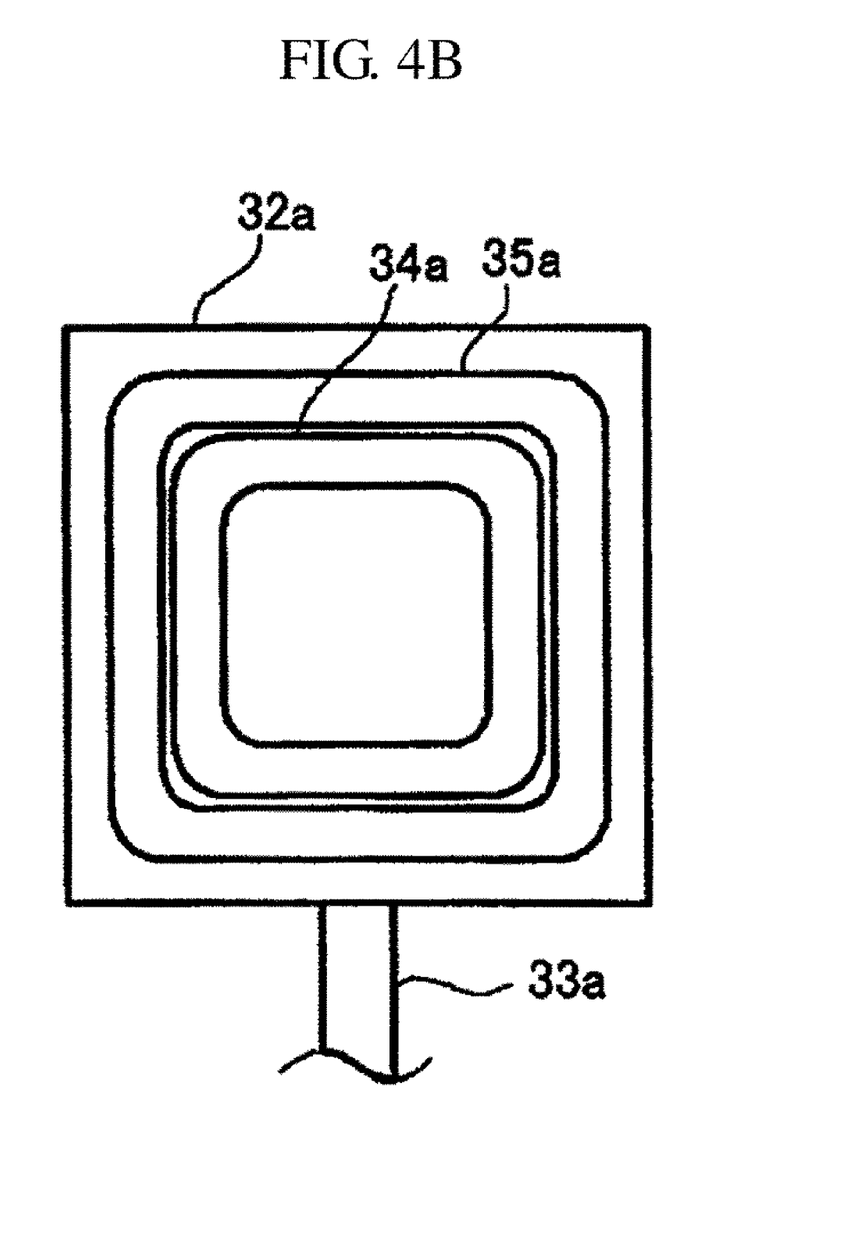
FIG. 4B is a plan view of a valve body of the gate valve.

FIG. 4A is a cross-sectional diagram of the gate valve of the semiconductor manufacturing apparatus according to another embodiment of the present invention. FIG. 4B is a plan view of a valve body of the gate valve.

Referring to FIGS. 4A and 4B, the structure is identical to the structure illustrated in FIG. 2 except that an O-ring 35a is additionally provided outside the O-ring 34a embedded in the gate valve 20a at a side of the processing unit 10. The O-ring 34a that is an inner O-ring is exposed to an atmosphere of the processing unit 10, rather than exposing the O-ring 35a that is an outer O-ring. Although it is very small, a clearance exists between the O-rings 34a and 35a.

The thermal insulator 30 between the gate valves 20a and 20b suppresses heat transfer from the processing unit 10 and prevents the temperature of the gate valve 20b at a side of the transfer chamber 8 from increasing. Although the O-rings 34a and 35a of the gate valve 20a are required to have thermal resistance, the O-ring 34b of the gate valve 20b is not required to have thermal resistance.

A single sealing member cannot easily satisfy all requirements in terms of sealability, plasma (radicals) resistance, thermal resistance, and microwave shielding. In the gate valve 20 according to the current embodiment, a plasma atmosphere may be efficiently blocked by combining O-rings having different characteristics and the blocking effect may be further increased by using double O-rings in the gate valve 20a. In addition to the blocking of the plasma atmosphere, deterioration of each of the O-rings 34a, 35a, and 34b may be minimized due to a combination of those functionalities and resistances, thereby preventing a generation of particles or reducing the number of times that the O-rings 34a, 35a, and 34b are changed.

For example, the O-ring 34a may be formed of tetrafluoroethylene-perfluorovinylether-based perfluoroelastomer (FFKM) having plasma (radicals) resistance and thermal resistance, and the O-ring 35a may be formed of a material having thermal resistance and electrical conductivity so as to shield microwaves. Since the O-ring 35a shields the microwaves, the O-ring 34b at the side of the transfer chamber 8 may be more efficiently protected from O-ring deterioration factors in comparison to a case when only the O-ring 34a is used.

Also, the O-ring 34b at the side of the transfer chamber 8 may have higher sealability than the O-rings 34a and 35a and may not consider plasma resistance or thermal resistance. The O-ring 34b is not exposed as much to deterioration factors such as a plasma atmosphere, and thus is not influenced by temperature variations or a high temperature. Accordingly, the O-ring 34b has high seal reliability and only has to be changed a small number of times.

The O-ring 35a of the gate valve 20a at the side of the processing unit 10 may have the same high sealability as the o-ring 34b at the side of the transfer chamber 8. The processing unit 10 may be blocked from the transfer chamber 8 by closing or opening only the gate valve 20a at the side of the processing unit 10. In this case, the gate valve 20b at the side of the transfer chamber 8 may be used to increase sealability, or may be used only when the O-rings 34a and 35a are changed. Since the O-rings 34a, 35a, and 34b of the processing unit 10 may be changed while the other processing units 11, 12, and 13 of the semiconductor manufacturing apparatus 1 are operating, an operating rate may be maintained.

The O-ring 35a may be protected from plasma (radicals) by introducing an inactive gas into the clearance between the inner O-rings 34a and the outer O-ring 35a. Also, deterioration of the O-ring 34a may be detected by measuring the amount of inactive gas introduced into the clearance or a pressure within the clearance and by determining whether a measured value exceeds a predetermined value. For this, a means for introducing the inactive gas into the clearance is required. Also, a means for measuring the amount of inactive gas or the pressure within the clearance is additionally required to detect deterioration of the O-ring 34a.

A combination of functionality or materials of O-rings may be arbitrarily selected based on a type of processing. In FIG. 4A, although the gate valve 20a at the side of the processing unit 10 includes double O-rings, the gate valve 20b at the side of the transfer chamber 8 may include double O-rings, or both of the gate valves 20a and 20b may include double O-rings. O-rings are not limited to the above embodiments and may be arbitrarily selected.

A semiconductor manufacturing apparatus according to another embodiment of the present invention will now be described.

The semiconductor manufacturing apparatus is, for example, an apparatus including a plasma processing unit. The semiconductor manufacturing apparatus according to the current embodiment will be described with reference to FIG. 1. Since the semiconductor manufacturing apparatus 1 and the processing unit 10 that functions as a plasma processing unit are described above with reference to FIGS. 1 and 3, detailed descriptions thereof will be omitted here. Also, the gate valve 20 between the transfer chamber 8 and the processing unit 10 of the semiconductor manufacturing apparatus 1 has already been described above with reference to FIG. 2 and thus, detailed descriptions thereof will be omitted here.

In the processing station 2 of the semiconductor manufacturing apparatus 1, the wafer W carried to one of the cassettes 5 is alternately passed through the transfer chamber 8 and each of the processing units 10, 11, 12, and 13 so as to be processed in the processing units 10, 11, 12, and 13 in the order. In most cases, an internal space of each of the transfer chamber 8 and the processing units 10, 11, 12, and 13 may be a space from which an inactive gas such as $N_2$ is purged in order to prevent a natural oxide film from being formed on a surface of the wafer W, a clean work area, or an area having an atmosphere different from a normal atmosphere. In particular, if processing includes plasma processing, each of the processing units 10, 11, 12, and 13 and the transfer chamber 8 is generally in a vacuum state instead of an atmospheric state.

The plasma processing is performed in the processing unit 10. The gate valve 20 that connects the processing unit 10 and the transfer chamber 8 includes double valves, that is, the gate valve 20a at a side of the processing unit 10 and the gate valve 20b at a side of the transfer chamber 8, and the thermal insulator 30 is interposed between the gate valves 20a and 20b.

When plasma is generated, the processing unit 10 is at a high temperature, and heat transfer occurs in the gate valve 20 connected to the processing unit 10. Although the gate valve 20a at the side of the processing unit 10 is at a high temperature, heat transfer is suppressed by the thermal insulator 30. The gate valve 20b is at the same temperature as the transfer chamber 8 does not have heat transfer to the transfer chamber 8, and does not thermal influence to the other processing units 11, 12, and 13. Since the gate valve 20b is not exposed at a high temperature and is not influenced by temperature variations, the O-ring 34b embedded in the gate valve 20b may be formed of a material based on sealability without considering thermal resistance.

As the O-ring 34a embedded in the gate valve 20a is formed of a material having plasma (radicals) resistance and thermal resistance, deterioration may be prevented and a plasma atmosphere of the processing unit 10 may be prevented from leaking toward the transfer chamber 8. As the O-ring 34b is protected from the plasma atmosphere by the O-ring 34a and is not influenced by temperature due to the thermal insulator 30, it is not exposed as much to O-ring deterioration factors. Accordingly, the O-ring 34b has high seal reliability and is changed a small number of times.

After the plasma processing is performed, although heat transfer occurs between the reaction chamber 40 at high temperature and the transfer chamber 8 at low temperature when the gate valve 20 is opened in order to carry the wafer W, the thermal insulator 30 suppresses heat transfer. The gate valve 20b at the side of the transfer chamber 8 is at the same temperature as the transfer chamber 8 (mostly kept at room temperature). Even if particles are generated in the processing unit 10 or in the gate valve 20, since the particles are adhered to an internal wall of the gate valve 20b due to a thermophoresis, the number of floating particles may be reduced and thus the wafer W or the processing unit 10 may be kept clean.

The O-ring 34a at the side of the processing unit 10 has plasma resistance and thermal resistance but should be more frequently changed than the O-ring 34b. Since the internal space of the processing unit 10 is independently operated by closing the gate valve 20b and separating the processing unit 10 from the transfer chamber 8, the processing units 11, 12, and 13 may operate even when the O-ring 34a is changed and when maintenance of the processing unit 10 is performed.

Also, the gate valve 20a of the gate valve 20 at the side of the processing unit 10 may include double O-rings, that is, the O-ring 34a that is an inner O-ring exposed to an atmosphere of the processing unit 10 and the O-ring 35a that is an outer O-ring surrounding the O-ring 34a, each of which has its own function. The plasma atmosphere may be efficiently blocked by using O-rings, each of which has a function in terms of one of plasma (radicals) resistance, thermal resistance, and microwave shielding.

Although plasma processing is described as an example of processing performed by a processing unit, the present invention is not limited thereto. However, the present invention may be useful for plasma chemical vapor deposition (CVD) process, sputtering process, etc. and, particularly, processing at high temperatures in a vacuum state. Also, the number of processing units adjacent to a transfer chamber may not be restrictive, and a gate valve according to the present invention may be used for at least one or all gate valves between the transfer chamber and each of the processing units.

Also, although an o-ring is described as a sealing member of a gate valve, any ring-shaped sealing member may be used. A cross-section of the sealing member may be, for example, a circular shape, a D shape, a rectangular shape with rounded corners, or an oval shape, in which a hole is formed in its center. Also, materials for forming the sealing member are not restricted to the above-mentioned materials.

As described above, according to the present invention, an operating rate may be maintained by preventing a generation of particles and a reduction in sealability, which is caused by deterioration of a sealing member.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A gate valve of a semiconductor manufacturing apparatus, which is arranged between a processing chamber in which processing is performed and a transfer chamber which carries a substrate on which the processing is performed, the gate valve comprising:

a first gate valve at a side of the processing chamber which opens and closes an opening of the processing chamber, the first gate valve including a first valve body and a first valve box, the first valve box including a first opening facing the opening of the processing chamber;

a first sealing member which is attached to the first valve body of the first gate valve and seals a clearance between the first opening and the first valve body;

a second gate valve at the side of the transfer chamber which opens and closes an opening of the transfer chamber, the second gate valve including a second valve body and a second valve box, the second valve box including a second opening facing the opening of the transfer chamber; and a second sealing member which is attached to a second valve body of the second gate valve and seals a clearance between the second opening and the second valve body, wherein the first and second gate valves are attached to each other such a manner that the substrate can be transferred from the transfer chamber into the processing chamber or vice versa through the first and second openings, and a thermal insulator is inserted between the first and second gate valves to suppress heat transfer from the first gate valve to the second gate valve, and wherein the first sealing member is formed of a first material and the second sealing member is formed of a second material having material properties different from the first material in terms of vacuum sealability and resistance to an atmosphere of the processing chamber.

2. The gate valve of claim 1, wherein resistance of the first sealing member to the atmosphere of the processing chamber is greater than that of the second sealing member.

3. The gate valve of claim 1, wherein the sealability of the second sealing member is greater than that of the first sealing member.

4. The gate valve of claim 1, wherein the processing is plasma processing, and wherein plasma resistance of the first sealing member is greater than that of the second sealing member.

5. The gate valve of claim 1, wherein the first sealing member comprises:

an inner sealing member which is placed adjacent to the processing chamber; and an outer sealing member which is placed to surround the inner sealing member.

6. The gate valve of claim 5, wherein a resistance of each of the inner and outer sealing members to at least one of heat, microwaves, and plasma (radicals) is greater than that of the second sealing member, and wherein a resistance of the inner sealing member to an atmosphere of the processing chamber is greater than that of the second sealing member.

7. The gate valve of claim 5, wherein the resistance of the inner sealing member to plasma (radicals) is greater than that of the outer sealing member to plasma (radicals), and wherein the sealability of the outer sealing member is greater than that of the inner sealing member, the sealability of the outer sealing member being equal to that of the second sealing member.

8. A semiconductor manufacturing apparatus comprising:

a processing chamber in which processing is performed;

a transfer chamber which carries a substrate on which the processing is performed; and the gate valve of claim 1 disposed between the processing chamber and the transfer chamber.

9. A semiconductor manufacturing apparatus comprising:

two or more processing chambers in which processing is performed;

a transfer chamber which carries a substrate on which the processing is performed; and two or more gate valves each disposed between the processing chamber and the transfer chamber, wherein at least one of the two or more gate valves is the gate valve of claim 1.

10. A gate valve of a semiconductor manufacturing apparatus, which is arranged between a processing chamber in which processing is performed and a transfer chamber which carries a substrate on which the processing is performed, the gate valve comprising:

a first gate valve at a side of the processing chamber which opens and closes an opening of the processing chamber, the first gate valve including a first valve body;

a first sealing member which is attached to the first valve body of the first gate valve and seals a clearance between the opening of the processing chamber and the first valve body;

a second gate valve at the side of the transfer chamber which opens and closes an opening of the transfer chamber the second gate valve including a second valve body; and a second sealing member which is attached to a second valve body of the second gate valve and seals a clearance between the opening of the transfer chamber and the second valve body, wherein a thermal insulator is inserted between the first and second gate valves to suppress heat transfer from the first gate valve to the second gate valve, and wherein the first sealing member is formed of a first material, and the second sealing member is formed of a second material having material properties different from the first material in terms of vacuum sealability and resistance to an atmosphere of the processing chamber.

* * * * *